(12) United States Patent
Thornton et al.

(10) Patent No.: US 7,084,488 B2
(45) Date of Patent: Aug. 1, 2006

(54) PACKAGED SEMICONDUCTOR DEVICE AND METHOD OF MANUFACTURE USING SHAPED DIE

(75) Inventors: Neill Thornton, Turlock, CA (US); Dennis Lang, Sunol, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 61 days.

(21) Appl. No.: 10/210,515

(22) Filed: Jul. 31, 2002

(65) Prior Publication Data
US 2003/0025183 A1    Feb. 6, 2003

Related U.S. Application Data

(60) Provisional application No. 60/309,635, filed on Aug. 1, 2001.

(51) Int. Cl.
*H01L 23/495* (2006.01)

(52) U.S. Cl. ........................ 257/666; 257/680

(58) Field of Classification Search ............... 257/502, 257/618, 620, 666, 672, 673, 676, 680, 691, 257/738, 787, 788, 796; 438/112, 113, 116, 438/123, 124, 127, 458, 462
See application file for complete search history.

(56) References Cited

U.S. PATENT DOCUMENTS

| | | | | |
|---|---|---|---|---|
| 5,105,536 | A |   | 4/1992 | Neugebauer et al. |
| 5,119,171 | A |   | 6/1992 | Lesk et al. |
| 5,250,841 | A | * | 10/1993 | Sloan et al. ................. 257/666 |
| 5,319,242 | A | * | 6/1994 | Carney et al. ............... 257/680 |
| 5,900,676 | A | * | 5/1999 | Kweon et al. ............... 257/787 |
| 6,049,124 | A | * | 4/2000 | Raiser et al. ................ 257/712 |
| 6,069,026 | A | * | 5/2000 | Terrill et al. ................. 438/109 |
| 6,198,163 | B1 |   | 3/2001 | Crowley et al. |
| 6,215,176 | B1 |   | 4/2001 | Huang |
| 6,307,755 | B1 | * | 10/2001 | Williams et al. ............ 257/666 |
| 6,384,492 | B1 | * | 5/2002 | Iversen et al. ............... 257/691 |
| 6,396,138 | B1 | * | 5/2002 | Cheah ......................... 257/692 |
| 6,399,418 | B1 |   | 6/2002 | Glenn et al. |
| 6,448,110 | B1 | * | 9/2002 | Chen et al. ................... 257/777 |
| 6,452,278 | B1 |   | 9/2002 | DiCaprio et al. |
| 6,528,880 | B1 | * | 3/2003 | Planey ........................ 257/735 |

FOREIGN PATENT DOCUMENTS

| DE | 10062542.8 | 6/2001 | | |
|---|---|---|---|---|
| JP | 01-134958 | * | 5/1989 | .................... 23/50 |

OTHER PUBLICATIONS

U.S. Appl. No. 09/464,885, filed Dec. 16, 1999, Joshi et al.

* cited by examiner

*Primary Examiner*—Douglas W Owens
(74) *Attorney, Agent, or Firm*—Townsend and Townsend and Crew LLP

(57) ABSTRACT

A semiconductor packaging technique provides for a semiconductor device with improved electrical and thermal performance. According to one embodiment of the invention, die edges are shaped before encapsulation to move the peripheral area of the die, which is more susceptible to stress and cracking, further inside the molding compound. This results in a device that can better withstand stress as well being more resistant to corrosion and other reliability problems caused by environmental conditions.

12 Claims, 7 Drawing Sheets

PACKAGED SEMICONDUCTOR DEVICE AND METHOD OF MANUFACTURE USING SHAPED DIE

RELATED APPLICATIONS

The present application derives priority from provisionally filed patent application No. 60/309,635, filed Aug. 1, 2000.

BACKGROUND OF THE INVENTION

The present invention relates in general to packaging of a semiconductor device, and more specifically to low thermal resistance packaging with improved reliability.

Semiconductor devices, such as power switching devices and very high frequency digital devices (e.g., microprocessors with many transistors), continue to generate excessive thermal energy. In measuring thermal performance of a semiconductor device, such as a power MOSFET device, the device is typically characterized by its ability to dissipate internally generated heat and its equivalent operational drain to source on resistance (or $RDS_{ON}$).

While silicon process technology has advanced significantly in recent years, semiconductor package technology remains essentially unchanged. Epoxy or solder die attach along with aluminum or gold wire interconnects is still employed for a great majority of device packages. FIG. 1 illustrates a conventional package and its wiring for an exemplary power MOSFET 100. Wire bonds 104 connect the source and gate terminals of the semiconductor die 108 to electrical conductors, such as conductive single trace comprising copper or the like. Die 108 and wire bonds 104 are encapsulated in body 102 made of, for example, molding compound suitable for power MOSFET applications.

For the exemplary power MOSFET 100, backside 110 of die 108 provides a drain connection. Die 108 is attached to a metal land 112 on a substrate such as a printed circuit board (PCB) 122 using die attach material such as solder that may be thermally and/or electrically conductive. Metal land 112 not only provides an electrical conduit to drain conductor 116 by way of one or more conductive vias 114, it also acts as a heat sink by providing a mechanism to dissipate heat within PCB 122.

Conventional packaging techniques such as that depicted in FIG. 1 tend to perform relatively poorly in terms of device on-resistance as well as thermal resistance. For example, the wire bonds add relatively large resistance to the otherwise low on-state resistance of the high current MOSFET. Also, placement of the wires on the terminals of the device is constrained by wire length, bond size relative to the bond pad area, and vertical clearance inside the molded body, among other factors. Even the relatively thick top metalization at each terminal adds resistance and is compounded by wire interconnect placement limitations. Further, die attach solder 112 adds to the thermal resistance of the device increasing the amount of heat that is generated internally when large current flow through the drain terminal. Another drawback of this type of package relates to the cost-prohibitive and difficult aspects of reworking such a packaged semiconductor device due, in part, to the encapsulated nature of the packaging. Other drawbacks include non-optimized and relatively think package profiles due to loop heights of wires used with conventional wire-bonding technology.

An improved semiconductor packaging technique allows the semiconductor die to protrude from the semiconductor package. The package is configured such that the backside of the die directly contacts a heat sink residing on a PCB. For this type of package, the die is typically singulated and prepared by grinding, lapping, sawing and other mechanical operations. Mechanical operations used to perform die preparation and processing can introduce "micro-cracks" into the die, especially at the die edge. This type of defect can reduce the strength, or "fracture toughness," of the die by as much as 70% if the die is made of, for example, silicon. The edge thus becomes a weakened zone adversely affecting the reliability of the die. In addition, the die edge with such defects may provide a path for moisture penetration between the die and the molding compound of the body. This subjects the device to corrosion and other environmental factors that further decrease the reliability of the device. Also, the metal-semiconductor contact providing the drain contact is close to the soldering surface of the package. The disadvantage of the contact being close to the soldering surface is that delamination of the metal from the silicon is more likely during the soldering process when flux and molten solder can come in contact with the edge of the metal-silicon contact or interface.

There is a need for improved packaging techniques that minimize electrical as well as thermal resistance for semiconductor devices, such as power MOSFETs, while improving reliability and manufacturability.

SUMMARY OF THE INVENTION

The present invention provides a semiconductor device and method of manufacturing the device which includes a shaped die. The device includes a lead frame that attaches to the first side of the die and makes electrical contacts to one or more terminals on the first side of the die. In one embodiment, the die includes one or more shaped edges along the side opposite to the first side. Also included is a body or housing that substantially envelopes the lead frame and the die. the die is positioned with respect to the body so that the die backside is exposed through a defined window disposed on one surface of the body.

The packaging technique according to the present invention does not require any wire bonding because the drain directly contacts a heat sink through an exposed window of the package. This also reduces $RDS_{ON}$ in case of a power MOSFET device. The resulting connections are more reliable compared to those produced by conventional wire bonding process. The package according to the present invention is thinner than conventional packages. Furthermore, because the drain pad is exposed through the body, the device has improved heat dissipation. Also, the shaping of the edge of the die according to the present invention provides a more reliable package in adverse environments.

The nature and advantages of the packaging technique of the present invention will be better understood with reference to the following detailed description and the accompanying drawings.

DETAILED DESCRIPTION OF SPECIFIC EMBODIMENTS

Figure 1:
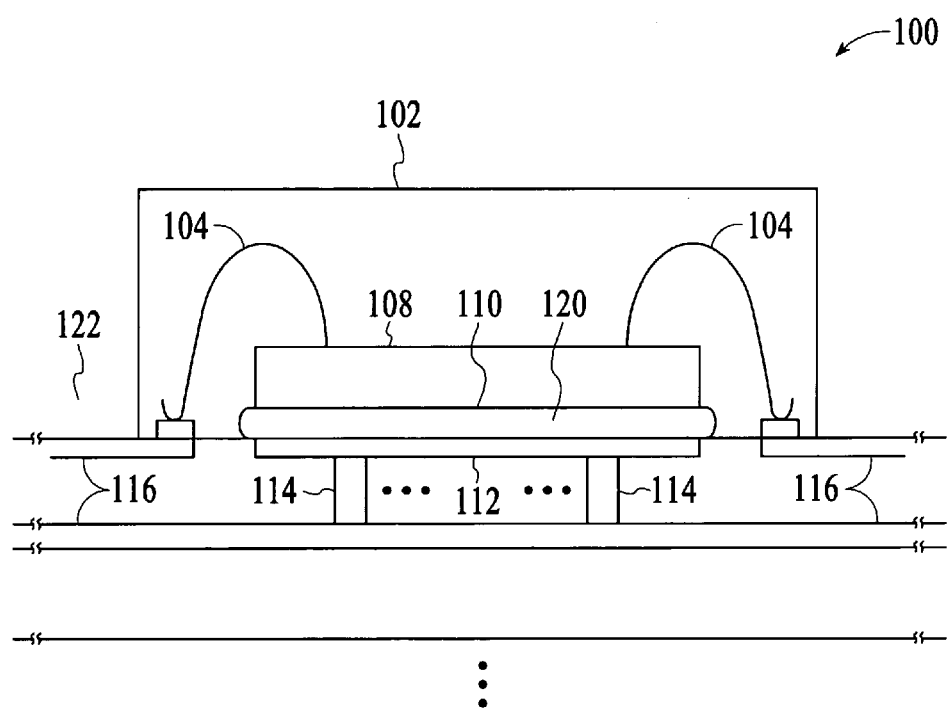
FIG. 1 shows a conventional power device package.
Figure 2:
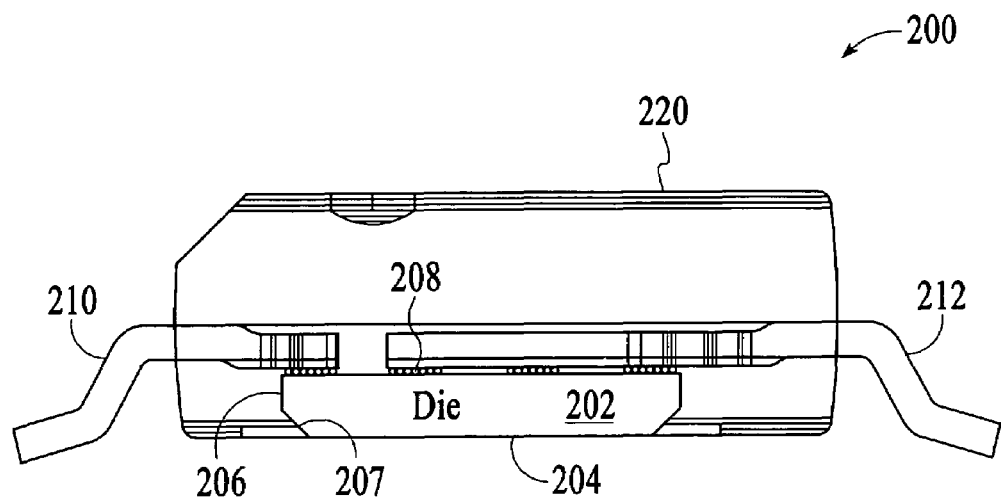
FIG. 2 illustrates a cross-sectional view of an exemplary semiconductor device according to an embodiment of the present invention.

The following describes the packaging technique of the present invention in the context of an exemplary power MOSFET device. It is to be understood, however, that the general concept of the present invention is applicable to different types of semiconductor devices and is not limited to the specific example described herein. Referring to FIG. 2, there is shown a cross-sectional view of an exemplary semiconductor device according to one embodiment of the present invention. In FIG. 2, semiconductor device 200 includes a die 202 having a backside 204, an edge 206 and a shaped or angled edge 207. The terminology "shaped edge" as used herein refers to an edge where two surfaces (side surface and top or bottom surface) of the die meet and where the edge is processed by for example an etching step to create a notch so that the angles formed by the notch are not 90 degrees. Die 202 is fabricated using any one of a variety of semiconductor materials including silicon, gallium arsenide, silicon germanium, or the like. Die 202 is electrically and mechanically connected via terminals 208 to a lead frame that includes leads 210 and 212 extending from a body 220 of the package. In the exemplary embodiment shown, terminals 208 are collapsed solder balls that provide for electrical contact between die 202 and lead frames 210 and 212. Other contact mechanism including solid pads can also be used to mechanically and electrically connect die 202 to frames 210 and 212. In a specific embodiment, body 220 is a two-piece molded material made of, e.g., a plastic molding compound.

By shaping edge 207 of die 202 so that it is angled inside body 220, the weakened zone that is vulnerable to microcracks is moved further inside the package where it is not in contact with the solder-die interface. This reduces susceptibility to mechanical stress and improves package reliability. The angled edge also provides for a much improved grip between die 202 and the plastic molding compound of body 220. This results in a much more robust package and significantly reduces the likelihood of delamination during the soldering process. The angled interface between body 220 and die 202 is also more resistant to moisture penetration as compared to a straight (90 degrees) interface. The resulting semiconductor package according to this embodiment of the present invention exhibits improved electrical and thermal performance as well as being more robust against adverse environmental conditions such as mechanical stress and high humidity.

Figure 3:
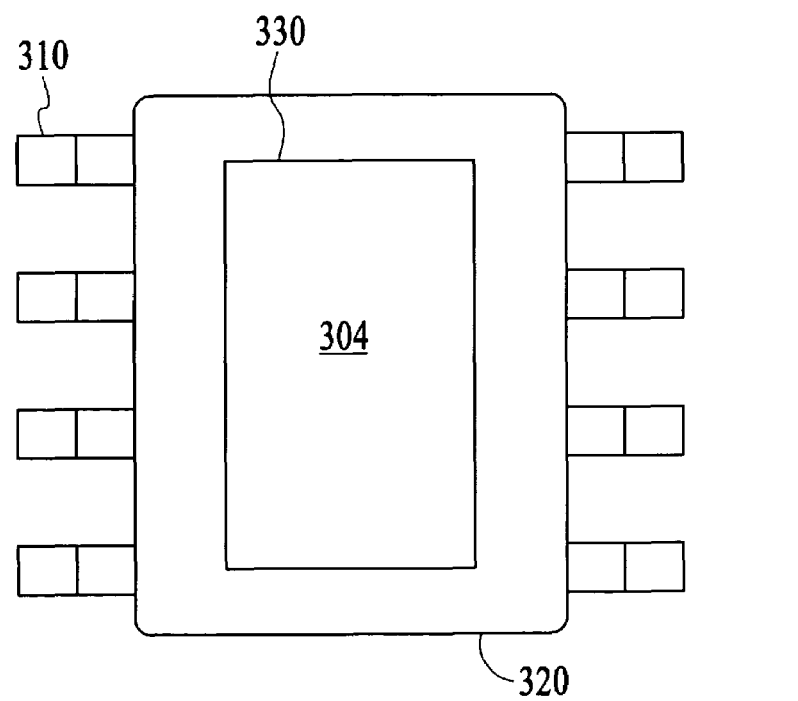
FIG. 3 is a bottom perspective view of a molded body or package for use with a semiconductor device in accordance with the present invention.

FIG. 3 is a simplified diagram of an exemplary device 300 illustrating a body 320 that has a window 330 defined therein. The backside of a die 304 is exposed through window 330 to make direct contact to a substrate such as a PCB. In the example shown, device 300 includes eight leads 310 that make contact to terminals on the side of die 304 opposite to the backside inside body 320. In one embodiment, the backside of die 304 is flush with the bottom of body 320 as shown in FIG. 2. In other embodiments the backside of die 304 is not on the same plane at the bottom of the package and may either protrude out or be recessed in with respect to the bottom of the package body 320. The edges of the die on the backside are angled as described above in the various embodiments.

Figure 4:
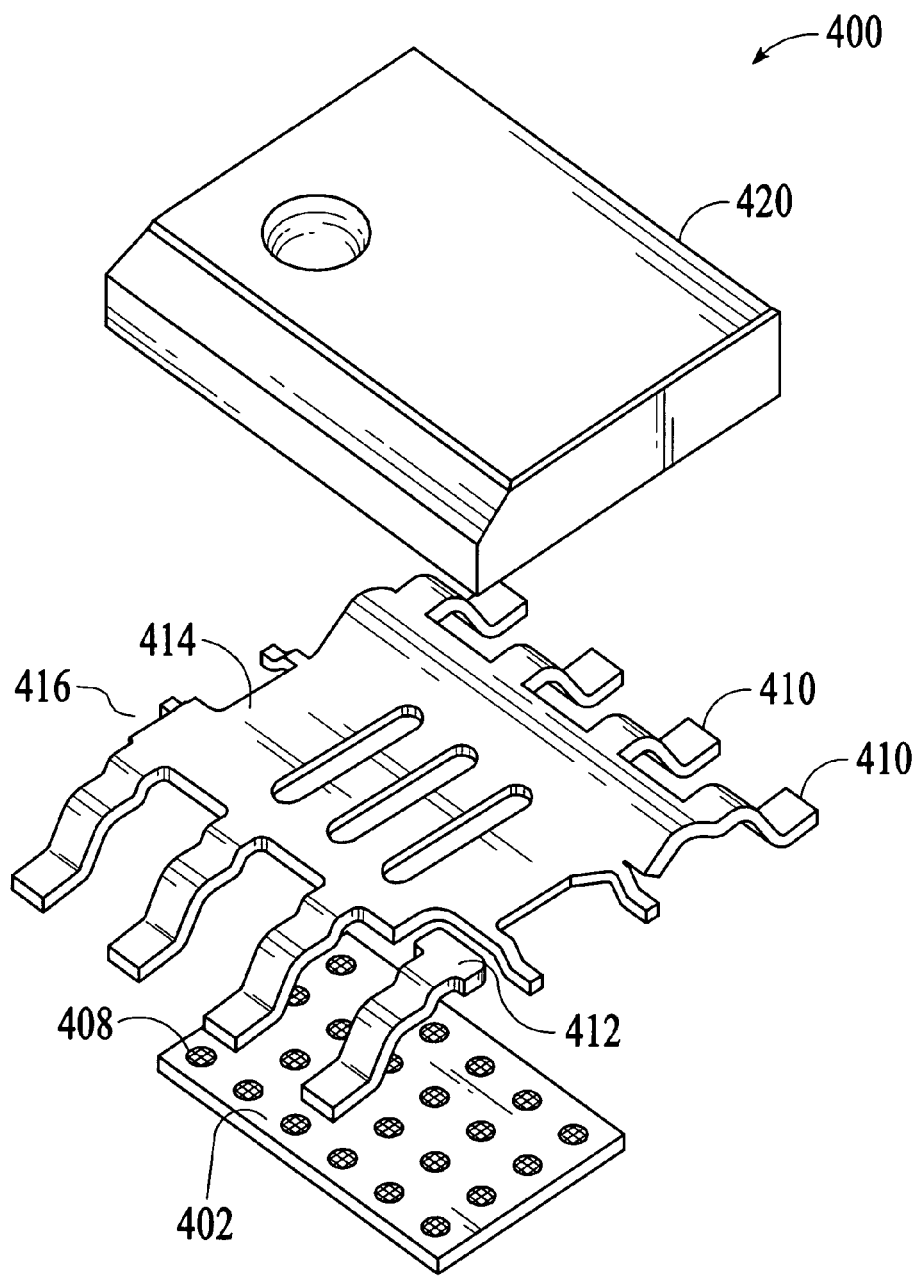
FIG. 4 depicts an exploded view of the semiconductor device illustrated in FIG. 2.

FIG. 4 provides an exploded view of a package according to an exemplary embodiment of the invention. In this example, die 402 is a power MOSFET transistor that includes an array of solder bumps 408 on its top surface. Bumps 408 provide electrical and mechanical connection to lead frame 416. Body 420 is made of, for example, thermo set polymers and is designed to meet dimensions that are equivalent to industry standard. In another embodiment, an under bump material is optionally located between die 402 and solder bumps 408. The under bump material (not shown) serves as an intermediate layer between the top surface of die 420 and solder bumps 408. In a specific embodiment, the under bump material is one of TiW, Cu, Au or an equivalent material suitable for practicing the present invention. Optionally, the under bump material is broken into three layers—Cu plating, sputtered Cu and sputtered Ti. As mentioned above, in an alternative embodiment, instead of solder balls 408, solid pads may be used for making the electrical and mechanical contact between die 402 and lead frame 416.

In the exemplary embodiment shown in FIG. 4, bumped die 402 is attached to lead frame 416 using, for example, flip-chip manufacturing techniques where the die is "flipped" from a sawn tape onto the lead frame. In this example, lead frame 416 includes a source pad 414 and a gate pad 412 each configured to provide the electrical and mechanical connection from at least one bump associated with a source interconnection to die 402 and to at least one bump associated with a gate interconnection to die 402. Source pad 414 provides an electrical connection to at least one external lead 410. Source pad 414 also dissipates heat from die 402 during operation of the device. In the embodiment shown in FIG. 4, seven leads 410 extend outside body 402 and provide for external connection to respective source terminals on die 402, and a single lead extending from pad 412 outside body 402 providing for a gate connection. In a specific embodiment, lead frame 416 comprises Ni or Ni—Pd plated Cu alloy. In another embodiment, the solder bump comprises 95Pb/5Sn or Pb-free solder with equivalent melting temperature.

Figure 5:
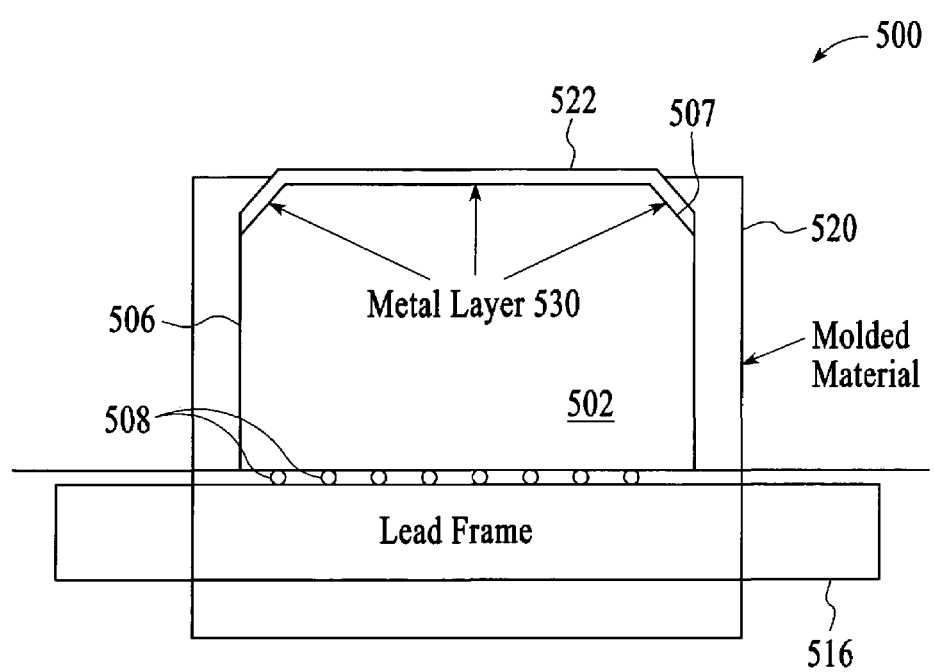
FIG. 5 is an alternate side view of an embodiment of the semiconductor device of FIG. 2.

FIG. 5 shows another exemplary device 500 including a die 502 whose dimensions are exaggerated to better illustrate the shaping of its edges. As shown, die 502 has sides 506 with notched or shaped edges 507 at the backside 522 of the die. A layer of conductive material such as metal 530 is layered onto the silicon to form a back metal covering shaped edges 507 and die backside 522. Die 502 is coupled to lead frame 516 by solder bumps 508. Device 500 is substantially encapsulated by body 520. Body 520 includes a window defined therein so that backside 522 of die 502 is exposed. Metal layer 530 promotes drain conductivity and provides an ohmic contact between the substrate and a heat sink residing, for example, on a PCB board. In one embodiment, the back metal comprises Ti—Ni, Al or other conductive material suitable for performing the function as a back metal.

Figure 6A:
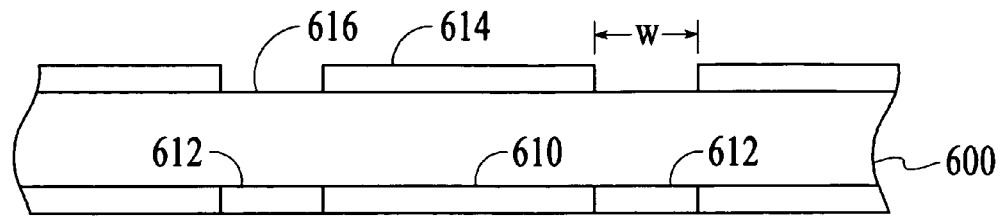
FIGS. 6A–6H are cross-sectional views showing the process flow of the packaging technique including the formation of a shaped die according to one embodiment of the present invention.
Figure 6B:
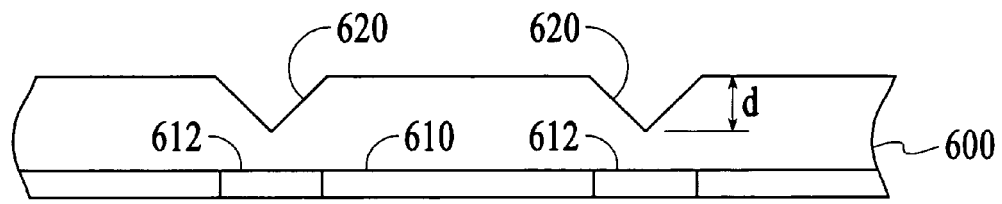

FIGS. 6A–6H provide a series of cross-sectional views illustrating the process flow for packaging a shaped die according to one embodiment of the present invention. In FIG. 6A, substrate 600 which may be a silicon or gallium arsenide wafer is used as the starting material. After the wafer undergoes the fabrication process and one or more dies 610 separated by scribe lines 612 are formed on the wafer, a mask layer 614 is deposited and patterned on the backside of substrate 600. Mask layer 614 may comprise, e.g., silicon nitride and may be formed on the wafer using, e.g., a low temperature plasma chemical vapor deposition process. Mask 614 is patterned to expose opening 616 on the backside of the wafer corresponding to scribe lines 612 on the opposite side. Grooves 620 are then etched into the backside of the wafer as shown in FIG. 6B. Although FIG. 6B shows "V-shaped" grooves 620, the grooves can have other geometric shapes known in the art. Each groove 620 is etched to a desired depth "d" and width "w" at its opening. Also, while a V-shaped group would result in, e.g., a 57 degree angle for a specific type of silicon, the angle can be controlled by appropriate etching mechanisms to any desired degree.

Figure 6C:
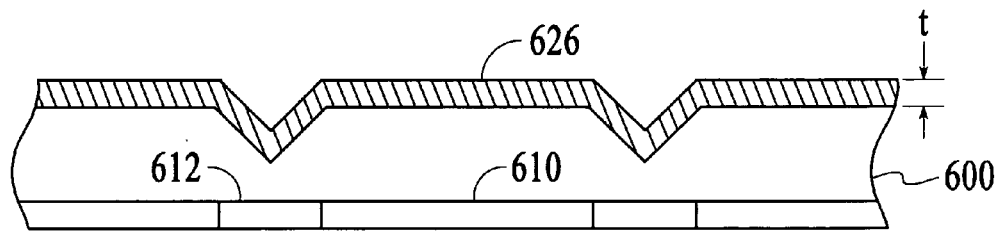
Figure 6D:
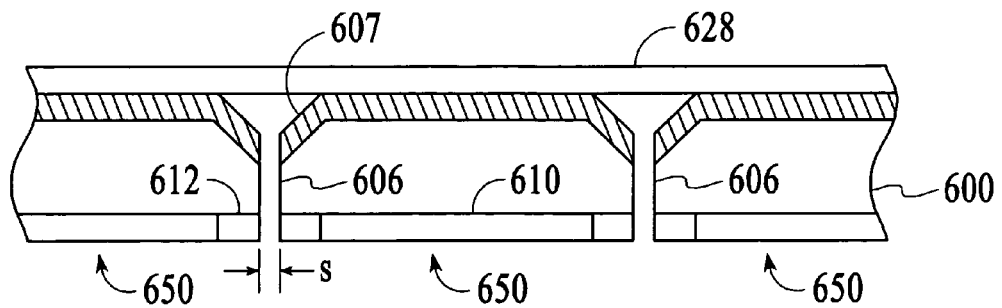

After mask layer 614 is removed, a metal layer 626 is deposited upon the backside including inside grooves 620 as shown in FIG. 6C. FIG. 6D depicts the formation of separate dies 650 by singulating the wafer along scribe lines 612. Singulation may be performed by conventional mechanical singulation methods, such as sawing, scribing, or other chemical singulation processes. An adhesive tape 628 may be used to support shaped die 650 after singulation. As shown in FIG. 6D, singulation produces multiple dies 650 having metal coated backside with shaped edges 607.

Figure 7:
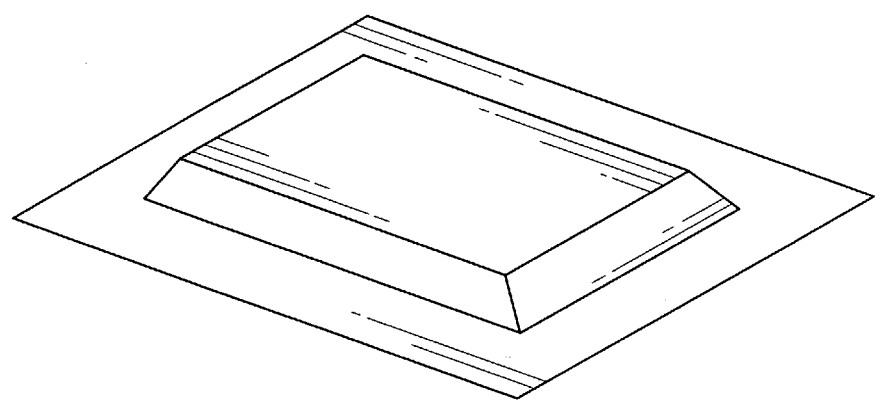
FIG. 7 shows a shaped die having both a shaped topside edge and a shaped backside edge.

In an alternative embodiment, the backside of substrate 600 is etched in regions 616 (FIGS. 6A and 6B) so that instead of a groove, a trough-shaped trench with a flat bottom is formed. The resulting singulated die will be surrounded by a flat region as shown in FIG. 7. In other embodiments, die edges on both the backside and the topside can be shaped for other packaging applications. Such a dual-edge shaped dies can be manufactured by, for example, repeating the steps shown in FIGS. 6A to 6B after performing the process up to device shown in FIG. 6C.

Figure 6E:
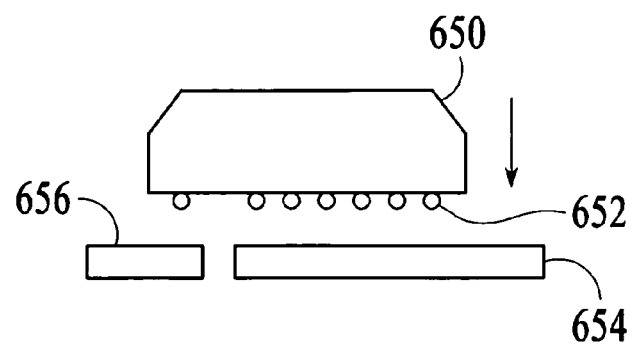
Figure 6F:
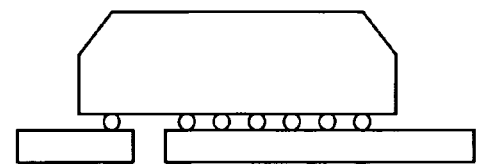
Figure 6G:
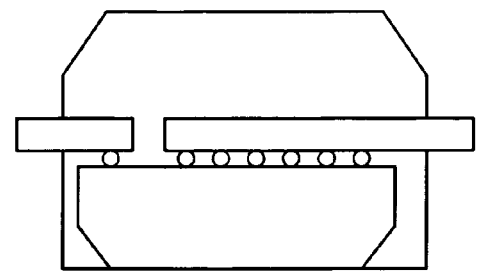
Figure 6H:
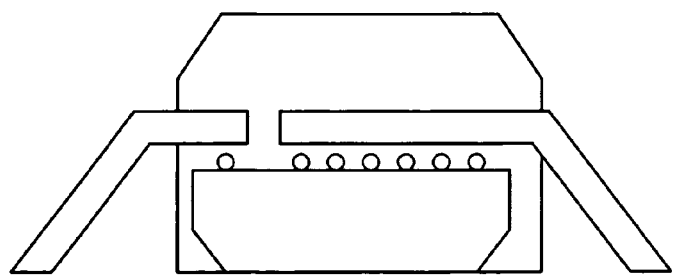

After the singulation process, the dies are ready for packaging. FIG. 6E shows a die 650 that has solder bumps 652 attached thereto and is ready to be attached to lead frames 654 and 656. Well known die attach processes can be used to attach die 650 to the lead frames as shown in FIG. 6F. The next step in the process involves encapsulation of the assembly in molding compound using molding equipment. This is shown in FIG. 6G, where the side of the die with shaped edges is exposed through a window in the molded housing. Finally, the lead frame is cut and leads are shaped using conventional assembly equipment resulting in the final package shown in FIG. 6H.

Although the invention has been described with reference to specific exemplary embodiments, it will be appreciated that various modification, alternatives and equivalents are possible. The scope of this invention should therefore not be limited by the specific embodiments disclosed and should instead be defined by the appended claims and their full breadth of equivalents.

What is claimed is:

1. A semiconductor device comprising:
    a die having a first surface and a second surface opposite to the first surface and side surfaces, one or more edges along the first surface of the die being notched to form one or more shaped edges;
    a lead frame coupled to the second surface of the die; and
    a body encapsulating the die and the lead frame with portions of the lead frame extending out of the body, the body having a window defined therein,
    wherein the die is positioned with respect to the body such that the first surface of the die is exposed through the window, and
    wherein the die comprises a power MOSFET and wherein the first surface of the die has a metallization layer providing a drain terminal of the MOSFET, wherein an exterior surface of the metallization layer is substantially coplanar with an exterior surface of the body.

2. The semiconductor device of claim 1 wherein the lead frame comprises a source lead portion coupled to a source terminal of the MOSFET and a gate lead portion coupled to a gate terminal of the MOSFET.

3. The semiconductor device of claim 1 wherein the first surface of the die is substantially flush with a bottom surface of the body.

4. A semiconductor device assembly comprising:
    the semiconductor device of claim 1; and
    a circuit board, wherein the semiconductor device is mounted on the circuit board and wherein the first surface of the die and the circuit board are electrically connected through the metallization layer of the die.

5. The semiconductor device of claim 1 wherein the lead frame comprises Ni or a Ni—Pd plated Cu alloy.

6. The semiconductor device of claim 1 wherein the lead frame includes seven source leads and one gate lead.

7. The semiconductor device of claim 1 wherein the metallization layer comprises Al.

8. The semiconductor device of claim 1 further comprising solder coupling the lead frame and the die.

9. A semiconductor device assembly comprising:
    a semiconductor device comprising
    a die having a first surface and a second surface opposite to the first surface and side surfaces, one or more edges along the first surface of the die being notched to form one or more shaped edges,
    a lead frame coupled to the second surface of the die, and
    a body encapsulating the die and the lead frame with portions of the lead frame extending out of the body, the body having a window defined therein,
    wherein, the die is positioned with respect to the body such that the first surface of the die is exposed through the window, wherein the first surface of the die protrudes from the window exposing portions of the one or more shaped edges; and
    a circuit board, wherein the semiconductor device is mounted on the circuit board and wherein the first surface of the die and the circuit board are electrically connected through the first surface of the die.

10. A semiconductor device comprising:
    a die having a first surface and a second surface opposite to the first surface and side surfaces, one or more edges along the first surface of the die being notched to form one or more shaped edges;
    a lead frame comprising leads coupled to the second surface of the die; and
    a body encapsulating the die, wherein the body defines a window,
    wherein the die is positioned with respect to the body such that the first surface of the die is exposed through the window, and
    wherein the die comprises a power MOSFET and wherein the first surface of the die has a metallization layer providing a terminal of the MOSFET, wherein an exterior surface of the metallization layer is substantially coplanar with an exterior surface of the body, and wherein the leads extend laterally from the body and have surfaces that are substantially coplanar with the exterior surface of the metallization layer and the exterior surface of the body.

11. The semiconductor device of claim 10 wherein the terminal is a drain terminal.

12. The semiconductor device of claim 10 wherein the metallization layer comprises Al.

* * * * *